(12) United States Patent
Ohmi et al.

(10) Patent No.: US 7,691,725 B2
(45) Date of Patent: Apr. 6, 2010

(54) METHOD FOR MANUFACTURING SEMICONDUCTOR DEVICE

(75) Inventors: Tadahiro Ohmi, 1-17-301, Komegafukuro 2-chome, Aoba-ku, Sendai-shi, Miyagi 980-0813 (JP); Akinobu Teramoto, Sendai (JP)

(73) Assignee: Tadahiro Ohmi, Sendai (JP)

( * ) Notice: Subject to any disclaimer, the term of this patent is extended or adjusted under 35 U.S.C. 154(b) by 0 days.

(21) Appl. No.: 10/544,491

(22) PCT Filed: Feb. 2, 2004

(86) PCT No.: PCT/JP2004/000983

§ 371 (c)(1),
(2), (4) Date: Aug. 4, 2005

(87) PCT Pub. No.: WO2004/070842

PCT Pub. Date: Aug. 19, 2004

(65) Prior Publication Data

US 2006/0051934 A1 Mar. 9, 2006

(30) Foreign Application Priority Data

Feb. 5, 2003 (JP) ............................. 2003-028085

(51) Int. Cl.
*H01L 21/30* (2006.01)
(52) U.S. Cl. ................ 438/459; 438/772; 438/777; 438/788; 438/791; 257/E21.123
(58) Field of Classification Search .......... 438/149, 438/772, 777, 787, 788, 789, 791, 455, 459
See application file for complete search history.

(56) References Cited

U.S. PATENT DOCUMENTS

| 6,143,628 | A | * | 11/2000 | Sato et al. ............. 438/455 |
| 6,309,945 | B1 | * | 10/2001 | Sato et al. ............. 438/409 |
| 7,012,311 | B2 | | 3/2006 | Ohmi et al. |
| 2001/0038153 | A1 | * | 11/2001 | Sakaguchi ............. 257/797 |
| 2002/0014666 | A1 | * | 2/2002 | Ohmi et al. ........... 257/368 |
| 2005/0087831 | A1 | | 4/2005 | Ohmi et al. |
| 2008/0224145 | A1 | | 9/2008 | Ohmi et al. |

FOREIGN PATENT DOCUMENTS

| JP | 10-088357 | 4/1998 |
| JP | 2001-160555 A | 6/2001 |
| JP | 2002-270801 A | 9/2002 |

OTHER PUBLICATIONS

K. Sakaguchi et al., "Current Progress in Epitaxial Layer Transfer (ELTRAN)," IEICE Trans. Electron., vol. E80-C:3, Mar. 1997, pp. 378-387.

T. Yonehara et al.. "Epitaxial layer transfer by bond and etch back of porous Si," Appl. Phys. Letters, vol. 64:16, Apr. 18, 1994, pp. 2108-2110, 1994 American Institute of Physics.

* cited by examiner

*Primary Examiner*—Walter L Lindsay, Jr.
*Assistant Examiner*—Reema Patel
(74) *Attorney, Agent, or Firm*—Foley & Lardner LLP

(57) ABSTRACT

An insulating film is formed as a pore-wall protective film (103) on pore walls in a porous layer (102) by the use of a mixed gas plasma of a noble gas and an insulating film forming gas generated by microwave excitation. As a result, the pore-wall protective film can have film properties as a protective film.

2 Claims, 3 Drawing Sheets

METHOD FOR MANUFACTURING SEMICONDUCTOR DEVICE

This application is a National Stage application of PCT/JP2004/000983, filed Feb. 2, 2004, which claims priority from Japanese patent application JP 2003-028085, filed Feb. 5, 2003. The entire contents of each of the aforementioned applications are incorporated herein by reference.

TECHNICAL FIELD

This invention relates to a method for manufacturing a semiconductor substrate and, in particular, relates to a method for manufacturing a semiconductor substrate of which a single-crystal layer is formed.

BACKGROUND ART

In semiconductor integrated circuits, there has conventionally been an SOI (Silicon On Insulator) structure in which elements are separated by an insulating layer. A bonding method is known as one of manufacturing methods for realizing the SOI structure. One type of this method is reported in Documents 1 and 2 noted below.

Document 1: Appl. Phys. lett. Vol. 64, No. 16, (T. Yonehara, et al) pp. 2108-2110 (1994)

Document 2: IEICE Trans. Electronics, E80-C, (K. Sakaguchi, et al) pp. 378-387 (1997)

The method reported in Documents 1 and 2 noted above is called an ELTRAN (Epitaxial Layer Transfer) method.

Further, in Document 3 (Japanese Unexamined Patent Application Publication (JP-A) No. 2002-270801), there is proposed a method for uniformly controlling the impurity concentration of a surface single-crystal silicon layer (SOI layer) being an epitaxially grown layer.

Referring to FIG. 1, the conventional semiconductor substrate manufacturing method described in Document 3 noted above will be schematically explained. First, as shown in FIG. 1 at (a), a first semiconductor substrate 201 is prepared. As the first semiconductor substrate 201, use is made of, for example, a boron-doped p-type high-concentration substrate having a boron concentration of about $5 \times 10^{18}$ cm$^{-3}$ and a resistivity of about 0.01 to 0.02 Ωcm. Subsequently, the surface of the first semiconductor substrate 201 is formed porous in a solution containing HF (Hydrogen Fluoride) or the like according to an anodizing method or the like, thereby forming a porous layer 202 as shown in FIG. 1 at (b).

Then, as shown in FIG. 1 at (c), a non-porous single-crystal silicon layer 203 is formed on the porous layer 202, wherein an oxide film or a nitride film is formed through a heat treatment at 300° C. to 500° C. as a pore-wall protective film for the porous layer 202 and the protective film is removed only at a surface portion of the porous layer 202.

Further, as shown in FIG. 1 at (d), a back seal film 204 is formed on the back side of the first semiconductor substrate 201. Then, as shown in FIG. 1 at (e), an epitaxially grown layer 205 is formed on the non-porous single-crystal silicon layer 203.

Subsequently, as shown in FIG. 1 at (f), a second semiconductor substrate 206 is bonded to the epitaxially grown layer 205 through an insulator layer 207 of silicon oxide or the like.

Then, the porous layer 202 is exposed by removing the back seal film 204 and the first semiconductor substrate 201 and separating the first semiconductor substrate 201 side and the second semiconductor substrate 206 side from each other at the porous layer 202 (FIG. 1 at (g)). In FIG. 1 at (g), the front and back sides in FIG. 1 at (f) are shown reversely.

Thereafter, the remaining unnecessary porous layer 202 is removed by etching, polishing, or the like, thereby exposing the non-porous single-crystal silicon layer 203 and the second semiconductor substrate 206 on both the front and back sides (FIG. 1 at (h)). Then, the surface of the non-porous single-crystal silicon layer 203 is smoothed depending on necessity. In this manner, there is manufactured an SOI wafer composed of the second semiconductor substrate 206, the insulating layer 207, and the epitaxially grown layer 205 (FIG. 1 at (i)).

On the other hand, in the method described in Document 3, when a heat treatment at 1000° C. or more is applied to the porous layer 202, a structural change occurs. In view of this, Document 3 describes that a protective film of silicon oxide, silicon nitride, or the like is preferably formed on the pore walls in a thickness of about 2 to 10 nm as the pore-wall protective film for the porous layer 202.

Document 3 describes that the pore-wall protective film is formed on the porous layer 202 through the heat treatment in an oxygen atmosphere at 300° C. to 500° C. However, when the silicon oxide film is formed in the oxygen atmosphere at the low temperature such as 300° C. to 500° C., the oxidation rate of silicon is extremely slow so that the manufacturing efficiency is quite low for forming the thickness of 2 to 10 nm.

Further, the properties of the oxide film formed in the oxygen atmosphere at the low temperature such as 300° C. to 500° C. are poor as compared with those of an oxide film formed at 1000° C. and thus its function as the protective film is low.

It is therefore an object of this invention that when forming a protective film, the manufacturing efficiency is improved at the low temperature such as 300° C. to 500° C. and, further, improvement in film properties can be realized.

DISCLOSURE OF THE INVENTION

In order to accomplish the foregoing object, in this invention, use is made of highly reactive radicals at the time of forming a protective film on a porous layer, thereby improving the reaction rate and, further, improving the properties of the protective film.

More specifically, this invention is applied to a semiconductor substrate manufacturing method that, in the state where a first single-crystal layer is formed on a porous layer formed on one surface of a substrate, forms a back seal film on another surface of the substrate and forms a second single-crystal layer on the first single-crystal layer. According to an aspect of this invention, before forming the first single-crystal layer, an insulating film is formed on the porous layer by the use of a mixed gas plasma of a noble gas and an insulating film forming gas generated by microwave excitation and then the insulating film, on a surface of the porous layer on which the first single-crystal layer is to be formed, is removed.

According to the aspect of this invention, also, the substrate and the porous layer are removed after bonding another substrate different from the foregoing substrate to the second single-crystal layer through an insulating film.

Further, according to the aspect of this invention, the insulating film forming gas contains an oxygen gas and the insulating film formed on the porous layer is a silicon oxide film. In this case, it is preferable that the insulating film forming gas contains a nitriding gas and the noble gas is particularly a krypton gas. On the other hand, the insulating film formed on the porous layer may be a silicon nitride film.

According to another aspect of this invention, there is provided a semiconductor substrate manufacturing method for use in a method of manufacturing a semiconductor substrate configured to have a single-crystal layer on an insulator layer by forming a porous layer, the semiconductor substrate manufacturing method characterized by forming a protective film on pore walls of the porous layer in a mixed gas plasma of a noble gas and an insulating film forming gas generated by microwave excitation.

BEST MODE FOR CARRYING OUT THE INVENTION

Figure 1:
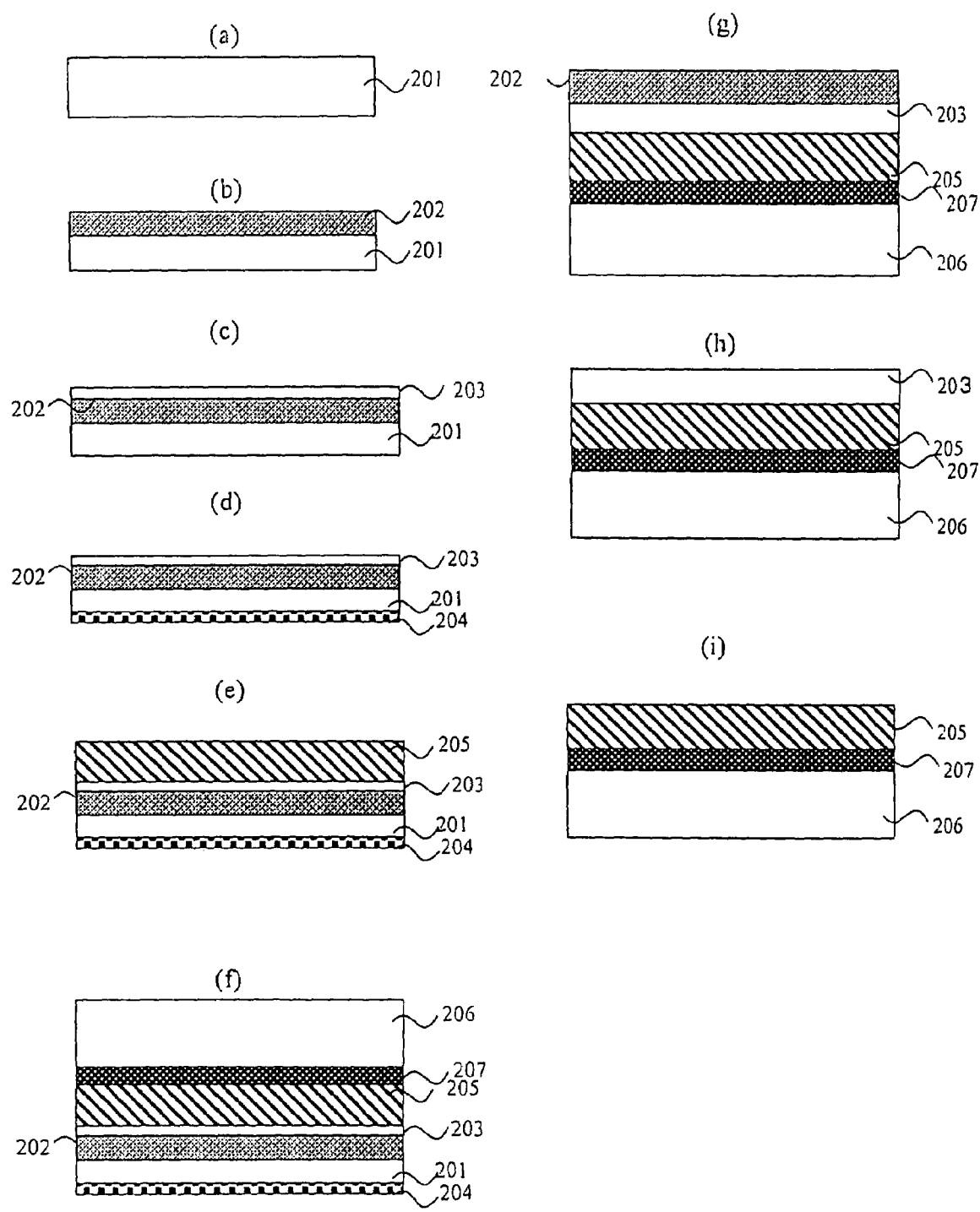
FIG. 1 is a diagram for explaining conventional semiconductor substrate manufacturing processes.
Figure 2:
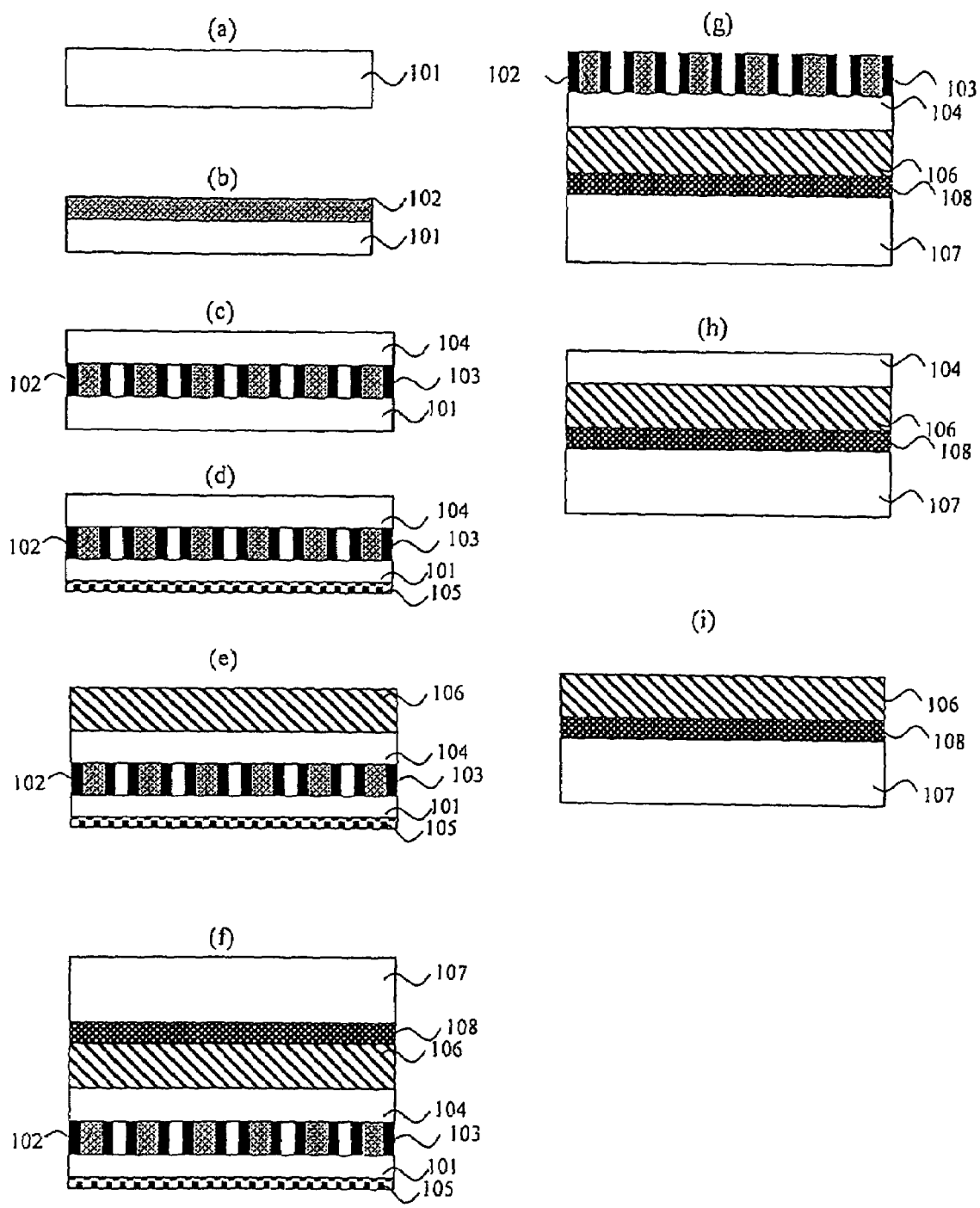
FIG. 2 is a diagram for explaining semiconductor substrate manufacturing processes according to an embodiment of this invention.

Referring to FIG. 2, description will be given of an embodiment of a semiconductor substrate manufacturing method according to this invention.

First, as shown in FIG. 2 at (a), a first semiconductor substrate (first single-crystal substrate) 101 is prepared. As the first semiconductor substrate 101, use is made of, for example, a boron-doped p-type high-concentration substrate having a boron concentration of about $5 \times 10^{18}$ cm$^{-3}$ and a resistivity of about 0.01 to 0.02 Ωcm.

Subsequently, as shown in FIG. 2 at (b), the surface of the first semiconductor substrate 101 is formed porous in a solution containing HF or the like according to an anodizing method or the like, thereby forming a porous layer 102.

Then, as shown in FIG. 2 at (c), an oxide film or a nitride film (hereinafter also referred to as a pore-wall protective film) 103 of about 8 nm is formed in a microwave-excited mixed-gas atmosphere of krypton and oxygen or ammonia at a temperature of 300° C. to 500° C. in one minute, as a pore-wall protective film for the porous layer 102. Subsequently, the protective film only at a surface portion, except the inside, of the porous layer 102 is removed by the use of a solution containing HF and a non-porous single-crystal silicon layer 104 is formed.

Figure 3:
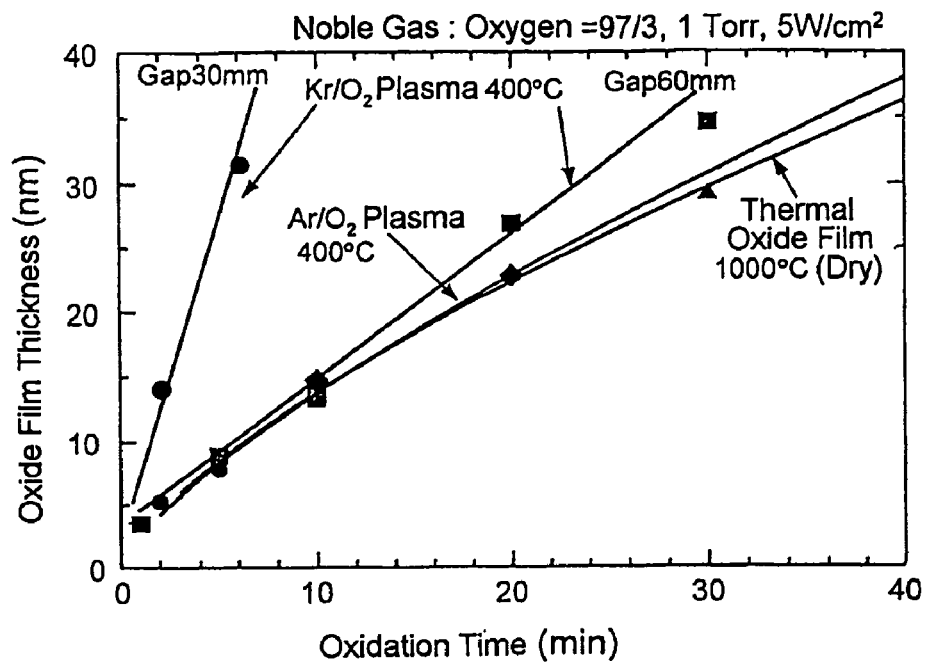
FIG. 3 is a characteristic diagram for explaining the growth rate of an oxide film of silicon in a microwave-excited krypton/oxygen mixed gas.
Figure 4:
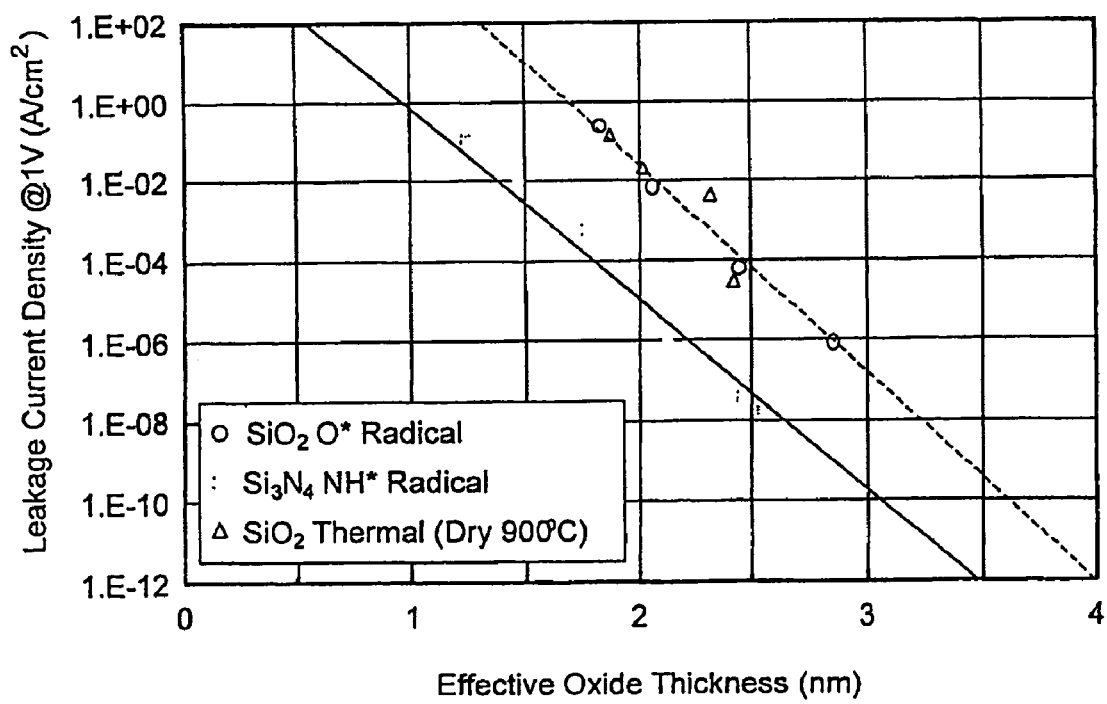
FIG. 4 is a diagram for comparing/explaining insulating properties of a silicon oxide film formed in a microwave-excited krypton/oxygen mixed gas, a silicon nitride film formed in a microwave-excited krypton/ammonia gas, and a conventional silicon oxide film formed at 1000° C.

In this event, as shown in FIG. 3, the growth rate of the oxide film formed as the protective film in the low-temperature plasma atmosphere is sufficiently faster than that of an oxide film formed at 1000° C. Further, as shown in FIG. 4, the insulating property of the oxide film formed in the low-temperature plasma atmosphere also exhibits the performance equal to or greater than that of an oxide film formed at 1000° C. As a result, it has been found that the oxide film formed in the low-temperature plasma atmosphere is effective as the protective film. Further, it has also been found that the solution containing HF used for removing the protective film is preferably as hydrophobic as possible.

Referring back to FIG. 2, after forming the pore-wall protective film 103 in the porous layer 102 in the process of FIG. 2 at (c), a back seal film 105 is formed on the back side of the semiconductor substrate 101 (FIG. 2 at (d)). Then, as shown in FIG. 2 at (e), an epitaxially grown layer 106 is formed on the non-porous single-crystal silicon layer 104.

Further, as shown in FIG. 2 at (f), a second semiconductor substrate 107 is bonded to the epitaxially grown layer 106 through an insulating layer 108 of silicon oxide or the like. Then, as shown in FIG. 2 at (g) on the upper side thereof, the porous layer 102 is exposed by removing the first semiconductor substrate 101 and separating the first semiconductor substrate 101 side and the second semiconductor substrate 107 side from each other at the porous layer 102. Thereafter, the remaining unnecessary porous layer 102 and pore-wall protective film 103 are removed by etching, polishing, or the like (FIG. 2 at (h)).

Subsequently, the surface of the non-porous single-crystal silicon layer 104 is smoothed depending on necessity. In this manner, as shown in FIG. 2 at (i), there is manufactured an SOI wafer composed of the second single-crystal substrate 107, the insulating layer 108, and the epitaxially grown layer 106. The noble gas used when forming the pore-wall protective film 103 in the porous layer 102 may be argon, xenon, helium, or neon instead of krypton.

The nitriding gas used when forming the foregoing pore-wall protective film may be nitrogen, a mixed gas of nitrogen and hydrogen, dinitrogen monoxide, or nitrogen monoxide instead of ammonia.

As described above, according to this invention, as the pore-wall protective film before growing the second single-crystal layer on the porous layer, the high-quality protective film is formed at the high rate by the use of the plasma obtained by microwave-exciting the noble gas and oxygen or the noble gas and ammonia gas to thereby make the pore walls stable, then the second single-crystal layer is formed, and therefore, surface silicon single crystals that form a semiconductor device or the like can be formed with high quality.

INDUSTRIAL APPLICABILITY

This invention is applicable to generally all semiconductor substrate manufacturing methods wherein a single-crystal layer is formed.

The invention claimed is:

1. A semiconductor substrate manufacturing method that, in the state where a first single-crystal layer is formed on a porous layer formed on one surface of a substrate, forms a back seal film on another surface of said substrate and forms a second single-crystal layer on said first single-crystal layer, said semiconductor substrate manufacturing method comprising:

before forming said first single-crystal layer, forming an oxide film or a nitride film in a microwave-excited mixed-gas atmosphere of krypton and oxygen or ammonia at a temperature of 300° C. to 500° C., as a pore-wall protective film for the porous layer, wherein a silicon oxide film or a silicon nitride film is formed as said pore-wall protective film, and said mixed-gas atmosphere comprises krypton and oxygen or krypton and ammonia.

2. A semiconductor substrate manufacturing method according to claim 1, further comprising:

removing said substrate and said porous layer after bonding another substrate different from said substrate to said second single-crystal layer through an insulating film.

* * * * *